US006985425B2

United States Patent
Tsukuda et al.

(10) Patent No.: US 6,985,425 B2
(45) Date of Patent: Jan. 10, 2006

(54) ELECTRON BEAM RECORDER AND METHOD THEREOF

(75) Inventors: Masahiko Tsukuda, Suita (JP); Kazuhiro Hayashi, Kadoma (JP); Fumiaki Ueno, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 714 days.

(21) Appl. No.: 10/174,952

(22) Filed: Jun. 20, 2002

(65) Prior Publication Data

US 2003/0007444 A1    Jan. 9, 2003

(30) Foreign Application Priority Data

Jun. 22, 2001  (JP)  ............................... 2001-189230

(51) Int. Cl.
*G11B 9/00*  (2006.01)
(52) U.S. Cl. .................. 369/126; 369/100; 250/306
(58) Field of Classification Search ................ 369/126, 369/100, 112.01, 47.1; 250/306, 307
See application file for complete search history.

(56) References Cited

U.S. PATENT DOCUMENTS 6,636,460 B2 * 10/2003 Akiyama et al. ........ 369/13.14
6,741,524 B2 * 5/2004 Ichihara et al. .......... 369/13.01
6,838,675 B2 * 1/2005 Harada et al. ............. 250/307

FOREIGN PATENT DOCUMENTS

JP         11-288532         10/1999

* cited by examiner

*Primary Examiner*—Muhammad Edun
(74) *Attorney, Agent, or Firm*—Wenderoth, Lind & Ponack, L.L.P.

(57) ABSTRACT

Pits are exposed and formed on a resist master disc by an electron beam recorder. A leading end and a trailing end of each pit are substantially the same form. The electron beam recorder includes: an electron beam source that discharges electron beams; a voltage controller that generates voltages based on a predetermined information signals; control electrodes that deflect the electron beams based on the voltages; a shield plate having a passing position to pass the electron beams and a shielding position to shield the electron beams; and a turntable that carries and rotates the disc. The voltage controller controls the voltages applied to the control electrodes to substantially equalize a first velocity of the electron beams to travel from a first shielding position to the passing position with a second velocity of the electron beams to travel from the passing position to a second shielding position.

15 Claims, 12 Drawing Sheets

Fig.4A

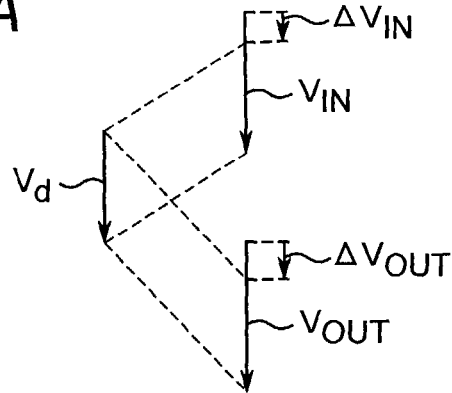

$V_d$: LINEAR VELOCITY OF MASTER DISC $V_{IN}$: TRAVEL VELOCITY OF ELECTRON BEAM FROM SHIELD PLATE TO SLIT (AT THE START OF EXPOSURE)

$\Delta V_{IN}$: RELATIVE VELOCITY OF ELECTRON BEAM TO MASTER DISC (AT THE START OF EXPOSURE)

$V_{OUT}$: TRAVEL VELOCITY OF ELECTRON BEAM FROM SLIT TO SHIELD PLATE (AT THE END OF EXPOSURE)

$\Delta V_{OUT}$: RELATIVE VELOCITY OF ELECTRON BEAM TO MASTER DISC (AT THE END OF EXPOSURE)

Fig.4B

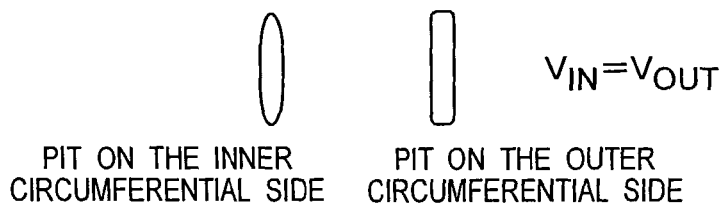

$V_{IN} = V_{OUT}$

PIT ON THE INNER CIRCUMFERENTIAL SIDE  PIT ON THE OUTER CIRCUMFERENTIAL SIDE

Fig.4C

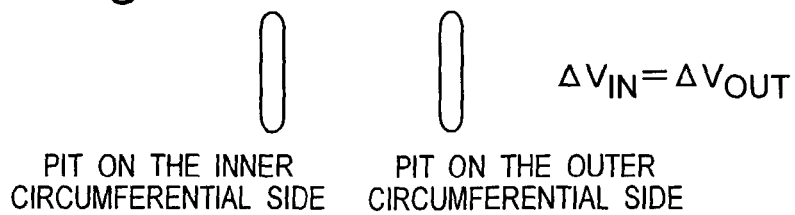

$\Delta V_{IN} = \Delta V_{OUT}$

PIT ON THE INNER CIRCUMFERENTIAL SIDE  PIT ON THE OUTER CIRCUMFERENTIAL SIDE

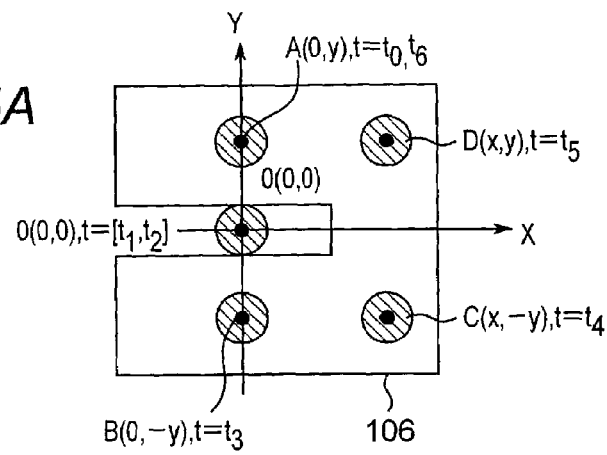
*Fig.5A*
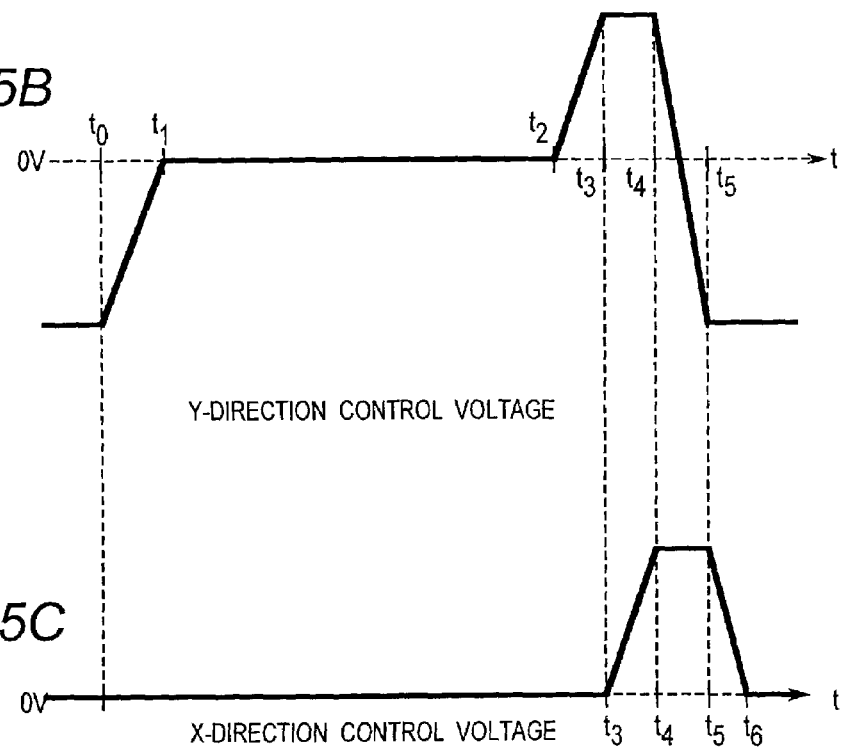
*Fig.5B*
Y-DIRECTION CONTROL VOLTAGE
*Fig.5C*
X-DIRECTION CONTROL VOLTAGE

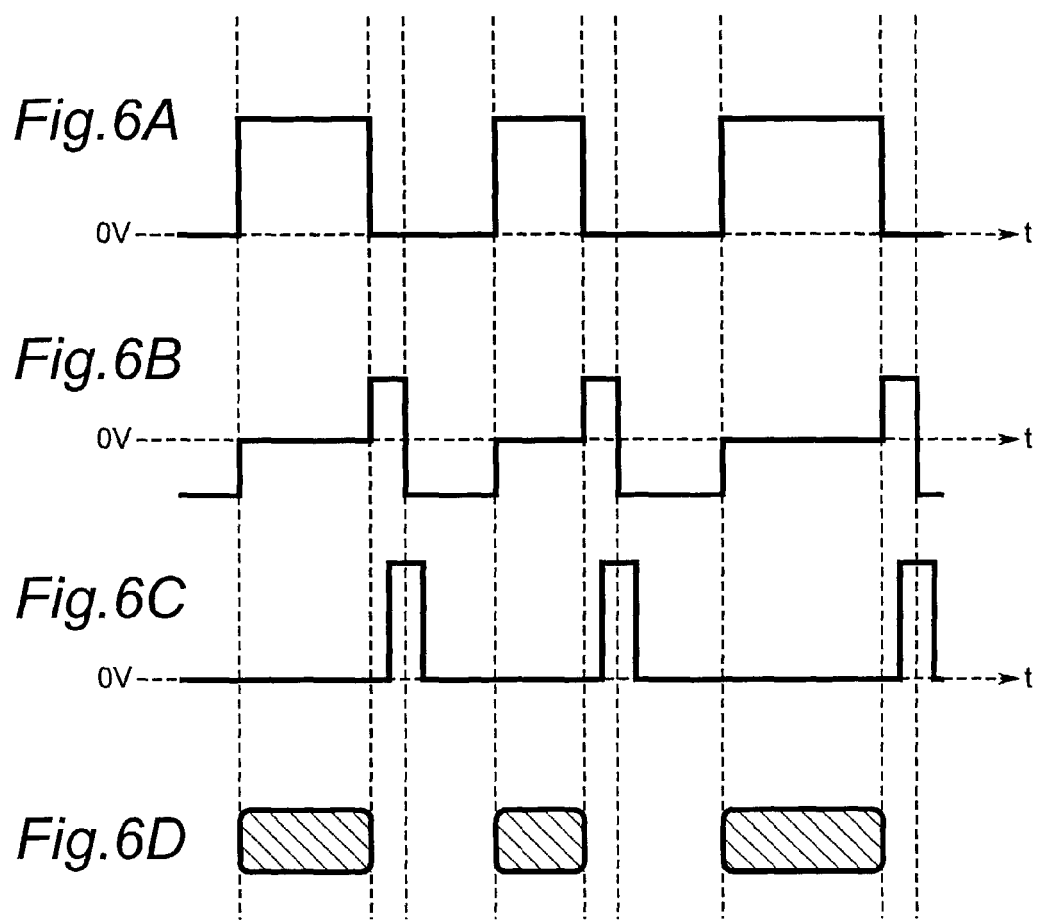

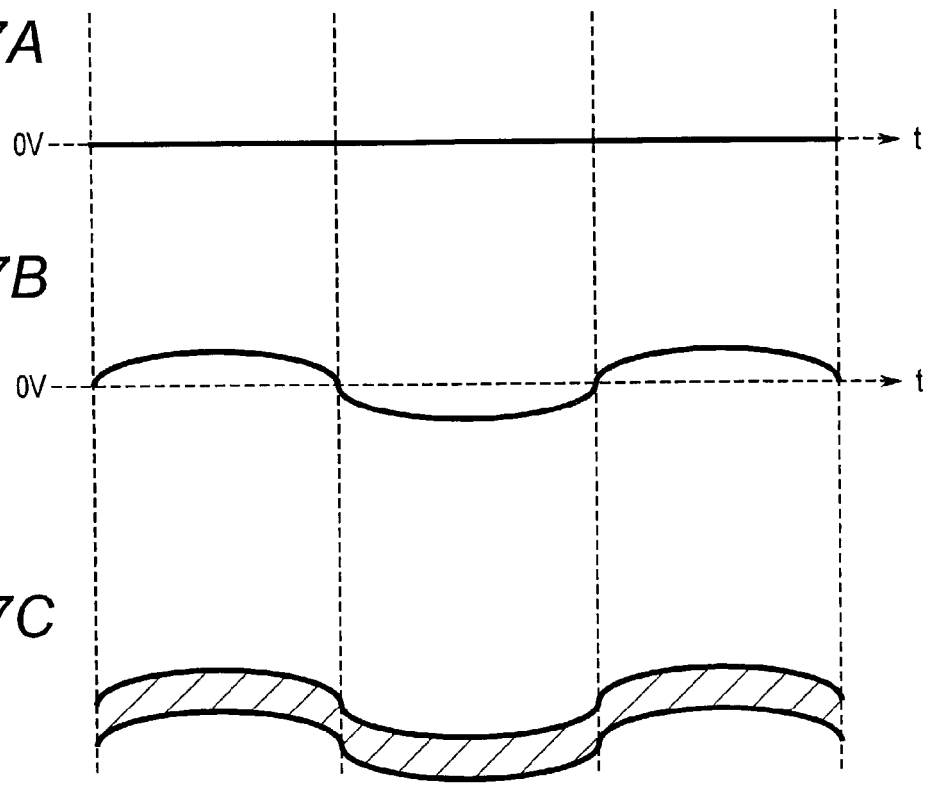

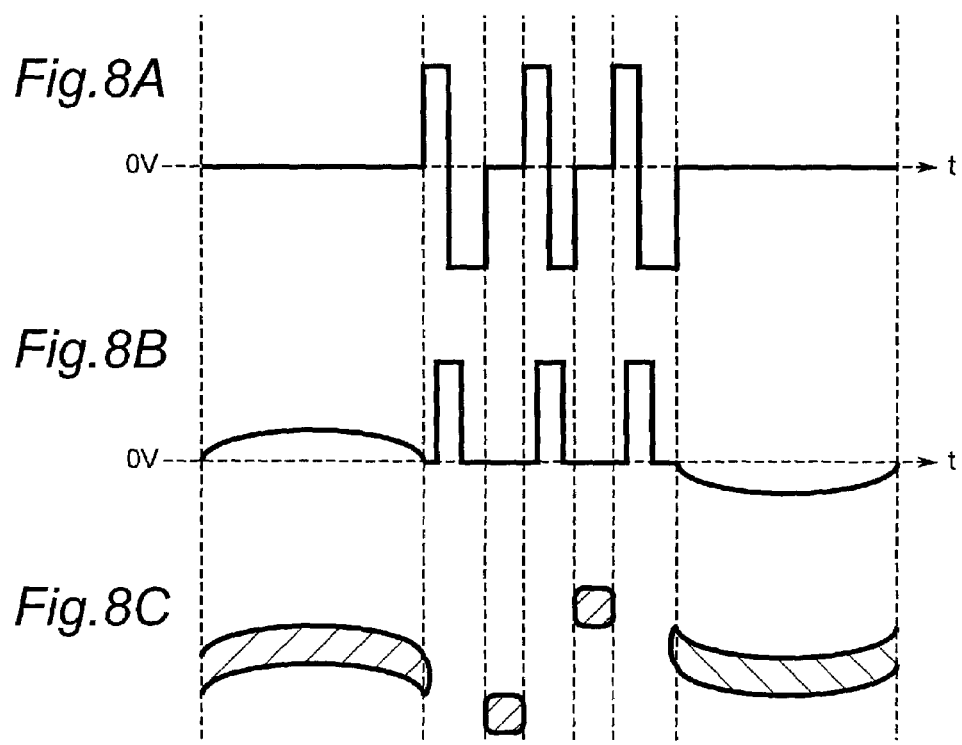

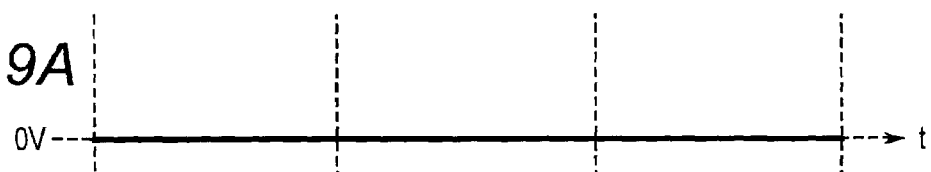
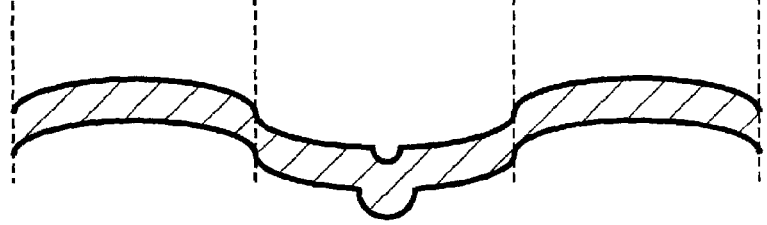

ELECTRON BEAM RECORDER AND METHOD THEREOF

BACKGROUND OF THE INVENTION

1. Field of the Invention

The present invention relates to a technique for manufacturing master discs of optical discs., and more specifically, to a technique for manufacturing master discs of high-density optical discs using electron beams.

2. Description of the Background Art

An electron beam recorder exposes and records signal patterns by focusing and irradiating electron beams on a master disc with resist applied. When the resist master disc with signal patterns exposed is developed, a master disc with concavo-convex shapes such as signal pits, and guiding grooves used for tracking at the time of record/reproduction can be obtained.

FIG. 10 is a schematic representation of conventional electron beam recorder 900. Electron beam recorder 900 includes electron beam source 901 that discharges electron beams, acceleration electrode 902 that accelerates the electron beams discharged from electron beam source 901, electron beam lens 903 that converges accelerated electron beam 912, and electrode 904 that varies a travel direction of electron beam 912 according to information signals. When an information signal is provided to a voltage controller (not illustrated), the voltage controller applies voltage to electrode 904 and deflects the electron beams. Electron beam recorder 900 further includes shield plate 905 that shields irradiation of the electron beams to resist master disc 907 when the electron beams are deflected, electron beam lens 906 that converges the electron beams onto resist master disc 907, resist master disc 907 with resist applied, turntable 908 that rotates resist master disc 907, and slider 909 that slides rotating turntable 908 in a radial direction of resist master disc 907. Each component of electron beam recorder 900 is arranged in a vacuum. Electron beam recorder 900 slides resist master disc 907 in the radial direction by slider 909 while rotating turntable 908, and exposes, i.e. records, signal patterns in the form of a spiral from the inner circumferential side of the circular resist master disc to the outer circumferential side or from the outer to the inner.

FIG. 11 shows a diagram of the positional relationship between shield plate 905 and the electron beams as viewed from the electron beam source 901 (FIG. 10). In the figure, resist master disc 907 is shown together. When voltage is not applied to electrode 904 (FIG. 10), the electron beams pass a position 921. Consequently, resist master disc 907 are irradiated with the electron beams. Because resist master disc 907 rotates in the direction designated by arrow mark 923, so-called pits are formed during irradiation of the electron beams. When a predetermined voltage is applied to electrode 904 (FIG. 10), the electron beams move to the direction of being shielded by shield plate 905 along passage 920 in the recording tangential direction and reach position 922. Therefore, in resist master disc 907, one or more areas which are not pit, that is, space, are formed. By moving the electron beams to position 921 or 922 along passage 920, desired patterns are formed on resist master disc 907. Edges of shield plate 905 are arranged to come in contact with the electron beams when the electron beams pass position 921.

FIGS. 12A through 12C explain specific examples of recording desired pit patterns. FIG. 12A shows a signal that forms a recording mark when voltage is of a high level and a space between pits when voltage is of a low level. The voltage controller (not illustrated) of electron beam recorder 900 (FIG. 10) generates modulating signals shown in FIG. 12B from the signal shown in FIG. 12A. When the voltage controller enters modulating signals into electrode 904 (FIG. 10), the electron beams are veered in a recording tangential direction based on the signals. To be more specific, when the modulating signal is 0V, the electron beams are applied to resist master disc 907 without being bent, and as modulating signals become negative voltages, the electron beams are veered in a direction of shield plate 905 (FIG. 11). When the modulating signal shown in FIG. 12B is entered into electrode 904 (FIG. 10), the electron beams make a round trip between positions 921 and 922 (FIG. 11) along passage 920 (FIG. 11), and pits are recorded. FIG. 12C shows the recorded pits.

In general, when the pit width to be recorded or width of guiding groove is changed, electron beam recorder 900 changes the rotating linear velocity of turntable 908 (FIG. 10) and adjusts an energy volume of the electron beams irradiated per unit area for resist master disc 907 (FIG. 1). This is because electron beam irradiation volume or electron beam acceleration voltage are unable to be varied at a high velocity. However, a setting of electron beam acceleration voltage can be varied. Varying the electron beam acceleration voltage can achieve the same effects obtained by varying laser beam wavelength when an optical disc is exposed using laser beams. Table 1 below shows relationships between electron beam acceleration voltage and converted laser beam wavelength. As clear from the table, as the acceleration voltage is increased, the converted wavelength is shortened. Consequently, the beam is able to be focused and therefore, optical discs can be highly densified.

TABLE 1

| Acceleration voltage (KV) | 5 | 10 | 15 | 20 | 25 |
|---|---|---|---|---|---|
| Converted wavelength (pm) | 248 | 124 | 83 | 62 | 50 |

However, in conventional electron beam recorders, it is difficult to realize high densification of discs. This is because when patterns are recorded with a conventional electron beam recorder, a tear-drop shape pit with widths of leading end and the trailing end varied is formed as shown in FIG. 12C, and a uniform-shape pit with the uniform shape of pit leading end and trailing end cannot be obtained. Under such conditions, when the minimum pit length is still more shortened as still higher densification takes place, there is a high possibility of causing read/write errors.

The reasons why uniform pits are unable to be formed include the following. Because first of all, in electron beam recorder 900 (FIG. 10), the electron beams make round trips between shield plate 905 and resist master disc 907, the electron beams scan the recording tangential direction only shown in passage 920 (FIG. 11). Consequently, with respect to the resist master disc rotating direction, the electron beams move onto resist master disc 907 in the forward direction at the start of recording and move in the reverse direction from resist master disc 907 to shield plate 905 in the end of pit recording. The energy volume of the electron beams per unit area applied to the resist master disc is large at the start of pit recording (that is, when the pit leading end is formed) and is small in the end of recording when the pit trailing end is formed). Consequently, the width of pit leading end is wide and that of pit trailing end becomes narrow.

SUMMARY OF THE INVENTION

It is an object of the present invention to form a pit of uniform shape with uniform shape of pit leading end and trailing end in the optical disc master disc fabricating process using electron beam recorders.

In order to solve the above problem, in the present invention, shield plates for shielding electron beams are arranged in the recording tangential direction of a resist master disc, edges of relevant shield plates are arranged opposite to each other with the electron beams applied to the resist master disc set at the center and at the same time to come in contact with the electron beams applied to resist master disc so that the irradiation energy volume of the electron beams to the resist master disc becomes same at the pit leading end and the trailing end by scanning the electron beams always in the fixed direction with respect to the recording direction. In addition, the electron beams are returned to the original pit recording initiation position with care to prevent the electron beams from being applied to the resist master disc while a mirror section is formed between pits, and are allowed to scan in the direction same as that when the former pit was formed. With this configuration, uniform signal pits with uniform pit leading end and trailing end can be formed.

This can be described specifically as follows.

The electron beam recorder according to the present invention includes an electron beam source that discharges electron beams; a voltage controller that generates voltages based on a predetermined information signals; control electrodes that deflect the electron beams based on the voltages generated by the voltage controller; a shield plate having a passing position to pass the electron beams and a shielding position to shield the electron beams; and a turntable that carries and rotates the resist master disc. The voltage controller controls the voltages applied to the control electrodes to substantially equalize a first velocity of the electron beams to travel from a first shielding position to the passing position with a second velocity of the electron beams to travel from the passing position to a second shielding position.

According to the present invention, by scanning electron beams constantly in the fixed direction along the recording tangential direction of the resist master disc, the irradiating energy volume of electron beams can be brought to be constant per unit area for the resist master disc at the pit leading end and the trailing end, and uniform signal pit patterns with uniform pit leading end and the trailing end shapes can be formed. Consequently, when optical discs are highly densified, for example, even when the minimum pit length is still more shortened and pit-to-pit intervals are reduced, errors in reading, etc. can be reduced.

The voltage controller may receive information on a rotating velocity of the resist master disc from the turntable to obtain a linear velocity of the resist master disc, and substantially equalizes a first relative velocity, defined from the linear velocity and the first velocity, with a second relative velocity, defined from the linear velocity and the second velocity.

Directions of the first velocity and the second velocity may be the same. The control electrodes may include a first electrode that deflects the electron beams in a first direction and a second electrode that deflects the electron beams in a second direction different from the first direction. The voltage controller may control each voltage applied to the first electrode and the second electrode to move the electron beams by deflecting from the second shielding position to the first shielding position via positions on the shield plate.

The directions of the first velocity and the second velocity may be the same as a rotating direction of the resist master disc.

The shield plate may includes: a first shielding section that defines the first shielding position; a second shielding section that defines the second shielding position; and a slit defined between the first shielding section and the second shielding section as the passing position. The shield plate may further include a third shielding section that connects the first shielding section to the second shielding section. The control electrodes may deflect to move the electron beams from the second shielding position to the first shielding position via the third shielding section.

A width of the slit may be substantially equal to a diameter of the electron beam.

The electron beam recorder according to the present invention records desired patterns on a resist master disc by passing and shielding electron beams. The recorder includes an electron beam source that discharges electron beams; a voltage controller that generates voltages based on a predetermined information signals; control electrodes that deflect the electron beams based on the voltages generated by the voltage controller. The recorder further includes a shield plate disposed between the control electrodes and the resist master disc, said shield plate having a first shielding section and a second shielding section as shielding positions to shield the electron beams, and a slit as a passing position to pass the electron beams; a turntable that carries and rotates the resist master disc. The control electrodes deflect the electron beams in arbitrary directions on the first shielding section, the second shielding section and the slit, based on the voltages generated by the voltage controller.

The electron beam recording method according to the present invention is used in an electron beam recorder to record desired patterns on a resist master disc by passing and shielding electron beams. The electron beam recorder may include: an electron beam source that discharges electron beams; a voltage controller that generates voltages based on a predetermined information signals; control electrodes that deflect the electron beams based on the voltages generated by the voltage controller; a shield plate having a passing position to pass the electron beams and a shielding position to shield the electron beams; and a turntable that carries and rotates the resist master disc. The electron beam recording method includes steps of: deflecting the electron beams to move from the first shielding position to the passing position at a first velocity; irradiating the resist master disc with the electron beams via the passing position; and deflecting the electron beams to move from the passing position to the second shielding position at a second velocity substantially equal to the first velocity. With this configuration, the above objective can be achieved.

The step of moving the electron beams at the second velocity may further includes steps of: receiving the information on a rotating velocity of the resist master disc from the turntable to obtain a linear velocity of the resist master disc; and substantially equalizing a first relative velocity, defined from the linear velocity and the first velocity, with a second relative velocity, defined from the linear velocity and the second velocity.

The directions of the first velocity and the second velocity may be the same.

The control electrodes may include a first electrode that deflects the electron beams in a first direction and a second electrode that deflects the electron beams in a second direction different from the first direction. The voltage controller may control each voltage applied to the first electrode and the second electrode to move the electron beams by deflecting from the second shielding position to the first shielding position via positions on the shield plate.

The directions of the first velocity and the second velocity may be the same as a rotating direction of the resist master disc.

The electron beam controlling method used in an electron beam recorder according to the present invention is provided. The electron beam recorder includes: an electron beam source that discharges electron beams; a voltage controller that generates voltages based on a predetermined information signals; control electrodes that deflect the electron beams based on the voltages generated by the voltage controller; and a shield plate having a passing position to pass the electron beams and a shielding position to shield the electron beams. The electron beam controlling method including steps of: firstly changing the voltages at a predetermined variation per unit of time; deflecting the electron beams by the voltages changed in the firstly changing step to move the electron beams from a first shielding position to the passing position at a first velocity; secondly changing the voltages at the predetermined variation; and deflecting the electron beams by the voltages changed in the secondly changing step to move the electron beams from the passing position to a second shielding position at a second velocity substantially equal to the first velocity. Therefore, the above object can be achieved.

BRIEF DESCRIPTION OF THE DRAWINGS

This and other objects and features of the present invention will become clear from the subsequent description of a preferred embodiment thereof made with reference to the accompanying drawings, in which like parts are designated by like reference numerals and in which:

FIG. 4A is a vector diagram of relationships between the resist master disc and the electron beam velocity;

FIG. 4B is a diagram of pits formed under the conditions with incidence and retract travel velocities equalized;

FIG. 4C is a diagram of pits formed under the conditions with relative velocities at the start and at the end of exposure equalized;

FIG. 5A is a diagram of the electron beam position in the shield plate using X-Y coordinates;

FIG. 5B is a timing chart of timing of voltage applied to electrode 104 (FIG. 1);

FIG. 5C is a timing chart of timing of voltage applied to electrode 105 (FIG. 1);

FIGS. 6A through 6D are diagrams of control signals for exposing continuous pit patterns and the exposed patterns;

FIGS. 7A through 7C are diagrams of control signals for exposing wobble grooves and the exposed patterns;

FIGS. 8A through 8C are diagrams of control signals for exposing wobble grooves and pit addresses and the exposed patterns;

FIGS. 9A through 9C are diagrams of control signals for exposing wobble grooves and land prepit addresses and the exposed patterns;

DETAILED DESCRIPTION OF THE PREFERRED EMBODIMENTS

Referring now to the attached figures, preferred embodiments of the present invention will be described as follows.

(Embodiment 1)

Figure 1:
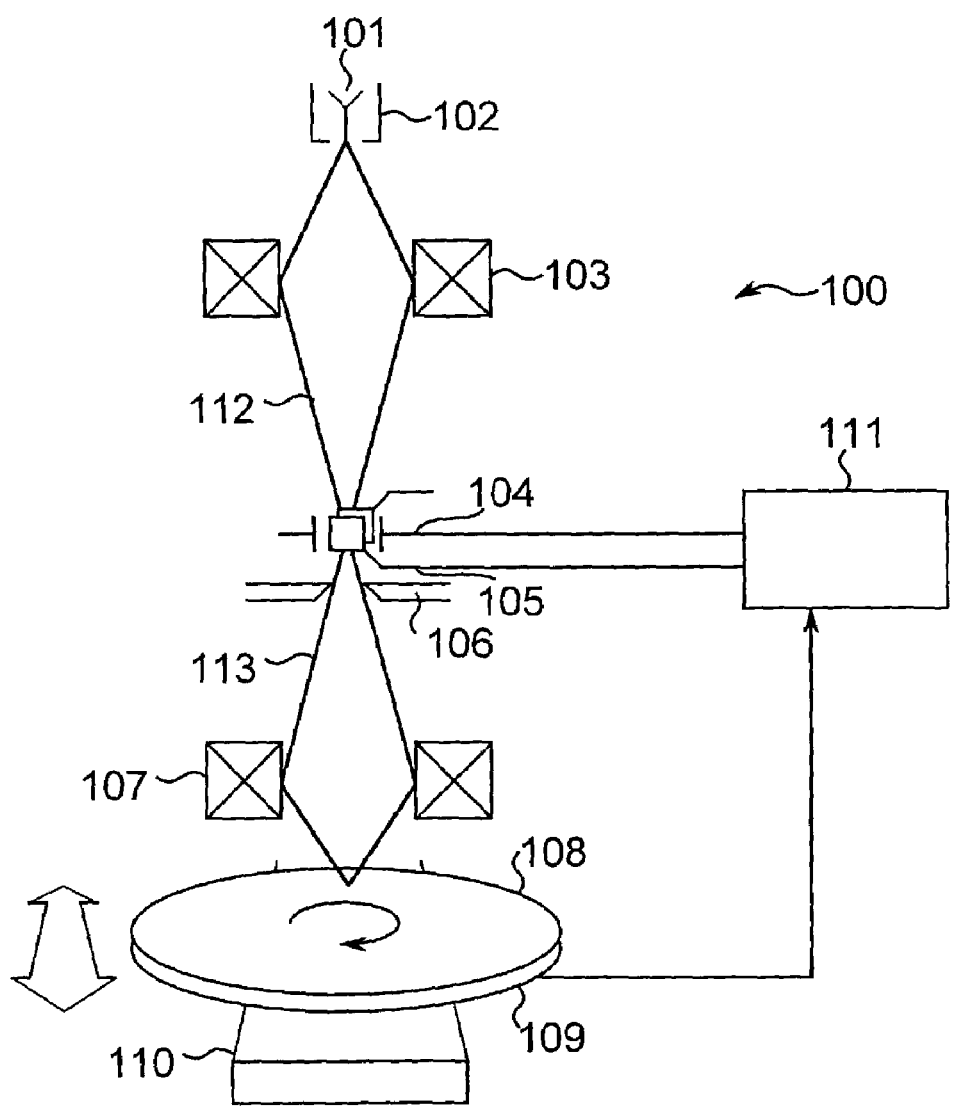
FIG. 1 is a schematic representation of a configuration of an electron beam recorder according to the present invention.

FIG. 1 is a schematic representation of a configuration of an electron beam recorder 100 according to the present invention. The electron beam recorder is an apparatus for focusing and irradiating electron beams onto a master disc with the photosensitive material (resist) and exposing and recording desired signal patterns on the disc. When the resist master disc with exposed signal patterns is developed, a master disc with concavo-convex shapes such as signal pits, and guiding grooves used for tracking at the time of record/reproduction can be obtained.

Now, description will be made on each component element of electron beam recorder 100. Each component element of electron beam recorder 100 is located in a vacuum as is the case of conventional recorders. Electron beam recorder 100 includes electron beam source 101 that discharges the electron beams, accelerating electrode 102 that accelerates the electron beams discharged from electron beam source 101, and lens 103 for the electron beams that converges accelerated electron beams 112.

Electron beam recorder 100 further includes control electrodes applied with voltages to deflect the electron beams and voltage controller 111 that generates voltages to be applied to the control electrodes. The control electrodes consist of electrode 104 applied with a voltage to deflect the electron beam in the recording tangential direction of resist master disc 108 and electrode 105 applied with a voltage to deflect the electron beam in nearly vertical direction to the recording tangential direction of resist master disc 108. The voltage controller 111 receives information signals corresponding to the desired exposure patterns and generates voltages applied to electrodes 104 and 105. The information signals are, for example, signals of patterns desired to be exposed. In addition, voltage controller 111 utilizes information on a rotating velocity of turntable 109 later discussed, calculates the linear velocity in the tangential direction at the position of resist master disc 108 irradiated with the electron beams, and decides a dose corresponding to the linear velocity. This operation will be later discussed in detail.

Electron beam recorder 100 further includes shield plate 106, electron beam lens 107, resist master disc 108 with resist applied, turntable 109 that rotates resist master disc 108, and slider 110. Shield plate 106 shields irradiation of the electron beams to resist master disc 108 when the electron beams are deflected. Electrodes 104 and 105 are about 10 cm away from shield plate 106. Electron beam lens 107 converges the electron beams onto resist master disc 108. For electron beam lenses, electrostatic lenses, electromagnetic lenses are known, and may be those that could achieve effects of converging the electron beams. Slider 110 slides rotating turntable 109 in the radial direction of resist master disc 108.

Next description will be made on the general operation of electron beam recorder 100. The electron beams discharged from electron beam source 101 are accelerated towards resist master disc 108 by the voltage applied to accelerating electrode 102. Accelerated electron beams 112 are converged at the centers of electrodes 104 and 105 by electron beam lens 103. In accordance with the voltage applied to electrodes 104 and 105, electron beams 113 which are not shielded at shield plate 106 are converged onto resist master disc 108 by electron beam lens 107. Therefore, resist master disc 108 is exposed. On the other hand, when electron beams 112 are shielded by shield plate 106, resist master disc 108 is not exposed. Electron beam recorder 100 slides resist master disc 108 by slider 110 in the radial direction while rotating turntable 109, and exposes (records) the desired signal patterns in the spiral form from the inner circumferential side of circular resist master disc 108 to the outer circumferential side or from the outer circumferential side to the inner circumferential side.

Primary features of the present invention lie in the configuration of shield plate 106 and electron beam control action utilizing shield plate 106. Now, discussion will be made on these features.

Figure 2:
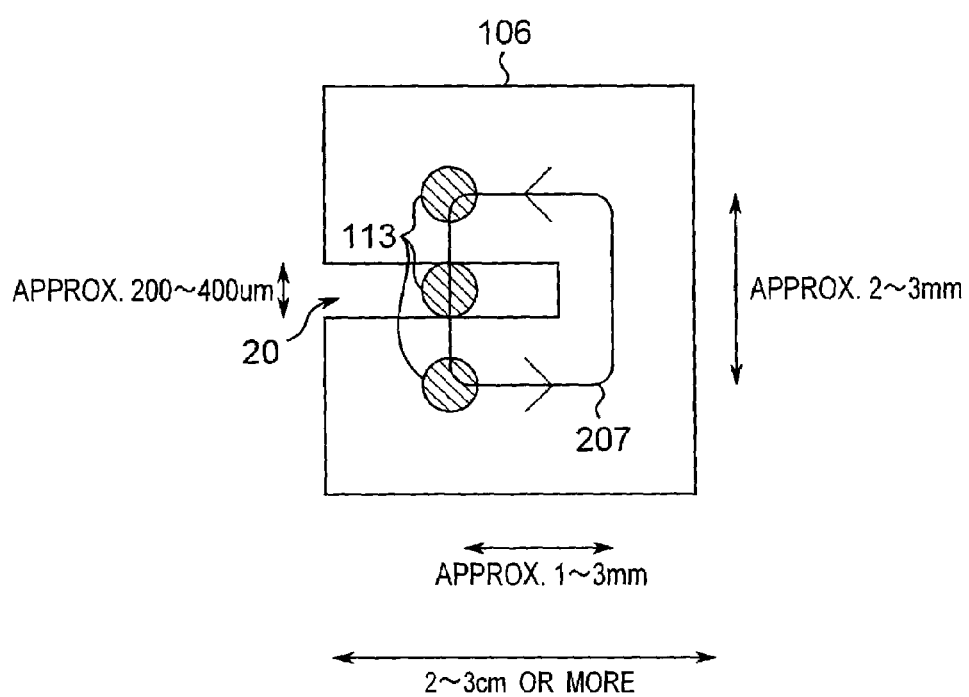
FIG. 2 is a diagram of a profile of a shield plate according to the present invention.

FIG. 2 shows a profile of shield plate 106. Shield plate 106 is a rectangle with each side 2 to 3 cm or longer and is a platy material with an opening (slit) 20 on one side. The width of slit 20 is about 200 to 400 μm. As illustrated, a diameter of electron beam 113 is substantially the same as the width of slit 20. Electron beams 113 move along one specified direction of counterclockwise shown by an arrow mark of passage 207 and when they pass slit 20, resist master disc 108 (FIG. 1) is irradiated with the electron beams. That is, slit 20 is the position through which the electron beams pass towards resist master disc 108. As illustrated, the travel amount in the direction which the electron beams go across slit 20 is approximately 2 to 3 mm and the travel amount in the direction parallel to slit 20 is approximately 1 to 3 mm. The travel of the electron beams is achieved by deflection of the electron beams by using electrodes 104 and 105.

Figure 3:
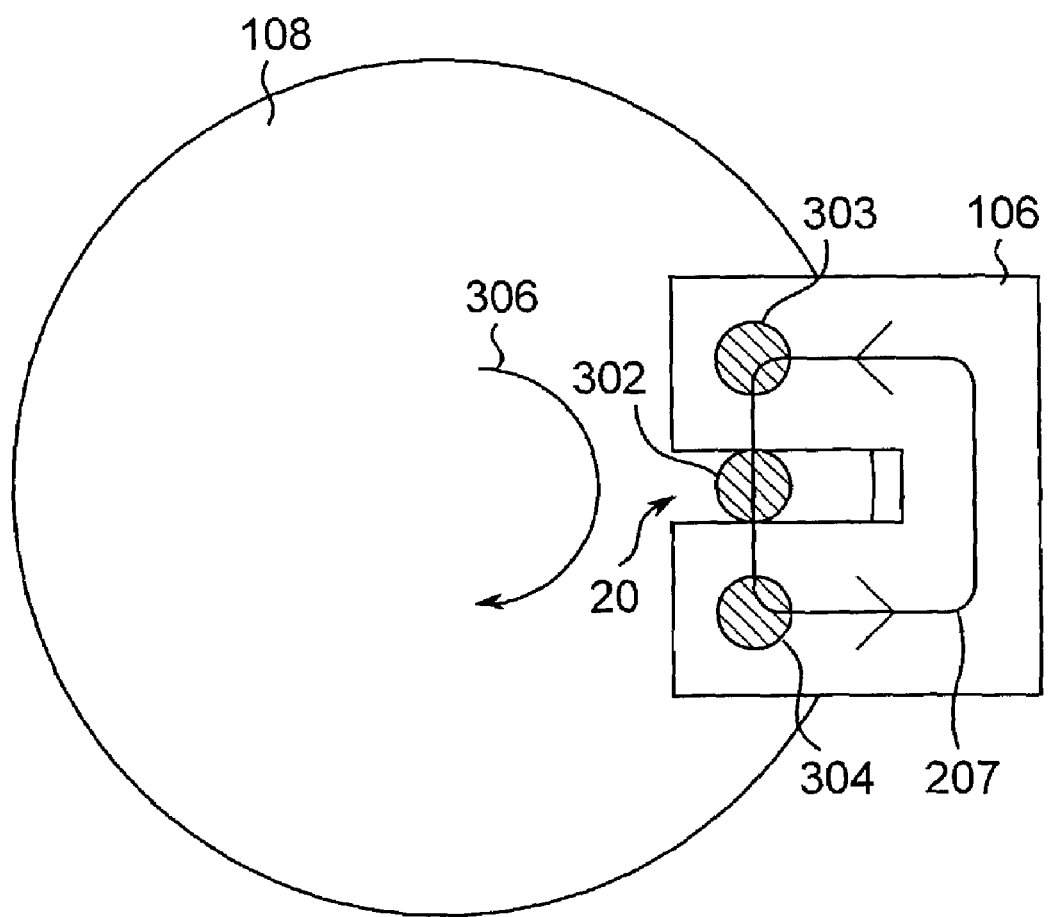
FIG. 3 is a diagram of the positional relationship between the shield plate and electron beam as seen from the electron beams source.
Figure 10:
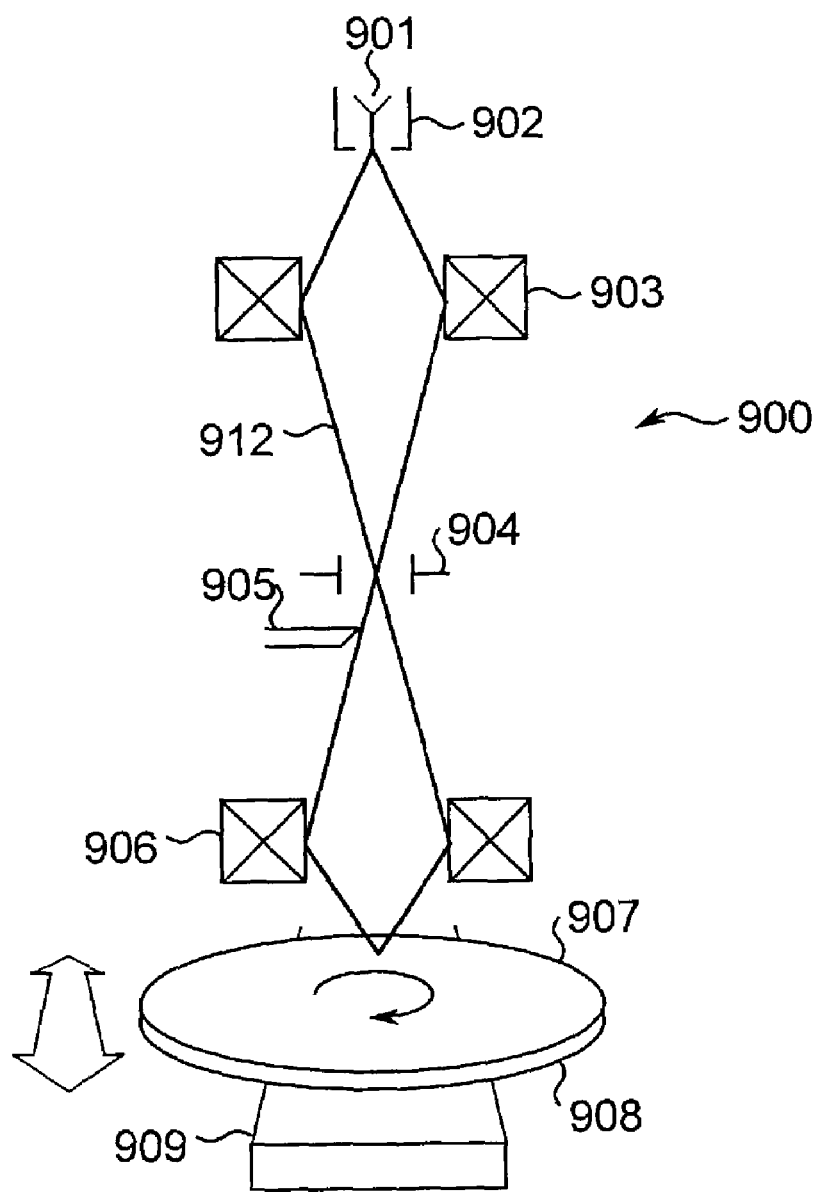
FIG. 10 is a schematic representation of a configuration of a conventional electron beam recorder.
Figure 11:
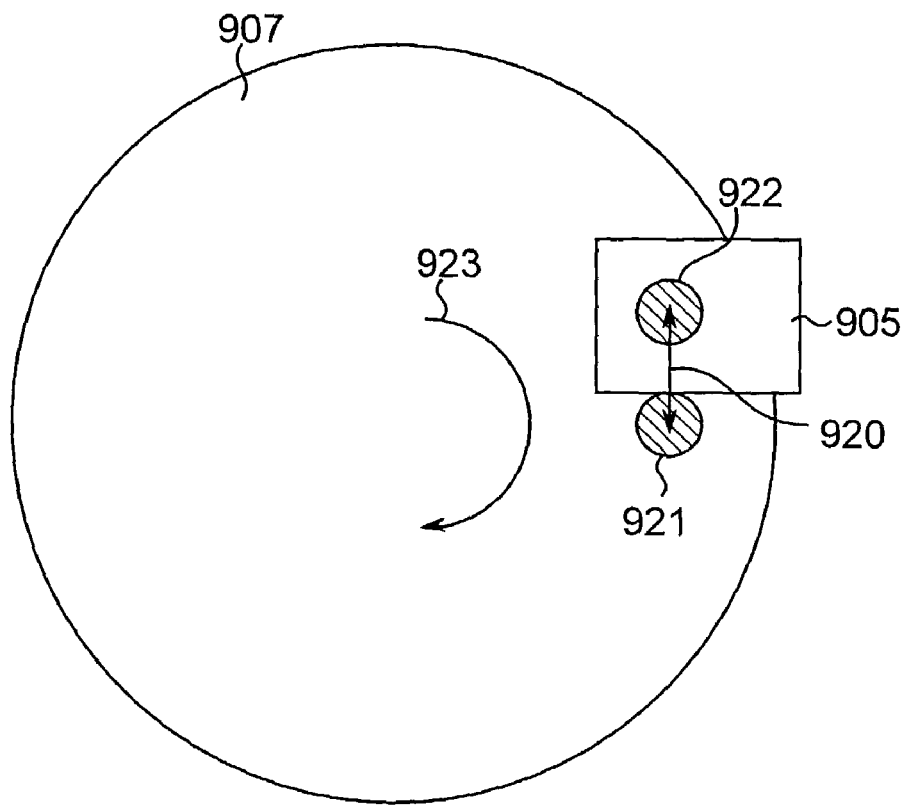
FIG. 11 is a diagram of the positional relationship between a shield plate and electron beam as viewed from the electron beam source side.
Figure 12A:
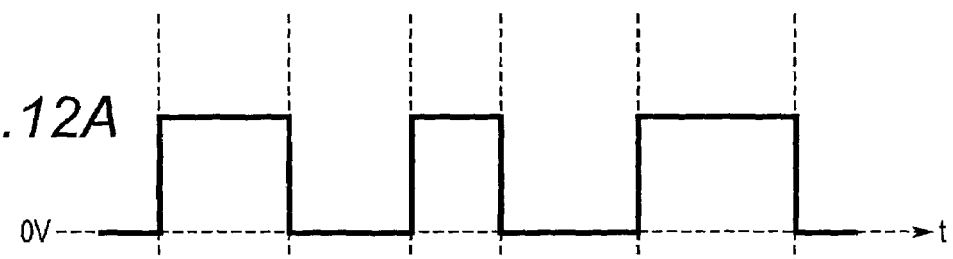
FIGS. 12A through 12C are diagrams explaining specific examples for recording the desired pit patterns from the specified information signals.
Figure 12B:
Figure 12C:
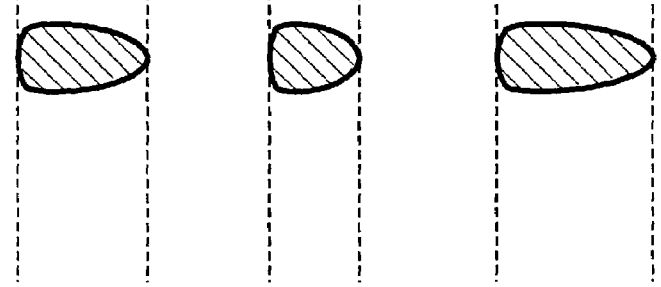

Referring now to FIG. 3 and using shield plate 106 according to the present invention, the manner how resist master disc 108 is irradiated with the electron beams is explained. FIG. 3 shows the positional relationships between shield plate 106 and the electron beams as seen from the electron beam source 101 (FIG. 1). Shield plate 106 that shields the electron beams is arranged in such a manner that the shielding sections are located opposite to each other in the recording tangential direction of the resist master disc with position 302 of the electron beams applied to resist master disc 108 set at the center. The section that connect these opposite shielding sections also function as shielding sections as discussed later. The edge of shield plate 106 is adjusted to come in contact with the electron beams at position 302 when resist master disc 108 is irradiated with the electron beams. The electron beams move in the arrow mark direction of passage 27 shown in FIG. 2. That is, applying voltage to electrode 104 can move the electron beams to the recording tangential direction of resist master disc 108. In addition, applying voltage to electrode 105 can move the electron beams to the direction nearly perpendicular to the recording tangential direction of resist master disc 108.

Now, general description is made on the procedure for irradiating resist master disc 108 with the electron beams and retracting the electron beams from on resist master disc 108. First of all, at position 303, a negative voltage is applied to electrode 104. Changing the voltage applied to electrode 104 from this condition to reference voltage, e.g. 0V, moves the electron beams from position 303 to position 302. Resist master disc 108 is irradiated with the electron beams and exposure begins, accordingly. Upon completion of the exposure, the voltage applied to electrode 104 is changed to positive. Then, the electron beams travel from position 302 to position 304. On the other hand, applying a positive voltage to electrode 105 causes the electrode beams to travel in the right direction of shield plate 106. Therefore, applying a positive voltage to electrode 105 during application of positive voltage to electrode 104 causes the electron beams to move from position 304 to the right direction in the figure. Thereafter, varying the applied voltage to electrode 104 successively to negative voltage and returning the applied voltage of electrode 105 to reference voltage, e.g. 0V, causes the electron beams to return to position 303.

That is, when resist master disc 108 is irradiated with the electron beams and, then, retracted from on resist master disc 108, magnitude and timing of voltage applied to electrode 104 and electrode 105 must be adjusted. The specific control concerning these will be described in detail referring to FIG. 5. Note that, a travel velocity of the electron beams is on the order of several ns (for example, 1–2 ns), and extremely high. The velocity for which control signals are entered exerts direct influences. That is, the travel velocity of the electron beams is subject to restrictions of a input signal velocity. Since the travel velocity in a counterclockwise direction from position 304 to position 303 is sufficiently fast, pits at intervals of about several micrometers can be continuously recorded.

What is extremely important when the electron beams are allowed to travel along passage 207 is the travel velocity of the electron beams when they travel from shield plate 106 to slit 20 and from slit 20 to shield plate 106. Referring now to FIGS. 4A through 4C, this will be described in detail. FIG. 4A is a vector diagram that shows relationships between resist master disc 108 and electron beam velocity. Needless to say, since the velocity has vector quantity, "two velocities are equal" means that magnitude and directions of two velocities are both equal. First of all, as shown in the diagram, for the travel velocity of the electron beams, two velocities, namely, the incidence travel velocity ($V_{IN}$) when the electron beams travel from shield plate 106 to slit 20 at the start of exposure and retract travel velocity ($V_{OUT}$) when the electron beams travel from slit 20 to shield plate 106 at the end of exposure, can be defined. Accordingly, two relative velocities of the electron beams with respect to the linear velocity ($V_d$) of rotating resist master disc 108 can be also defined. In the present case, they are the relative velocity ($\Delta V_{IN}$) at the start of exposure and the relative velocity ($\Delta V_{OUT}$) at the end of exposure. As clear from the diagram, these can be found from following Eqs. 1 and 2.

$$\text{Relative velocity at the start of exposure } (\Delta V_{IN}) = \text{incidence travel velocity } (V_{IN}) - \text{linear velocity of master disc } (V_d) \quad \text{(Eq. 1)}$$

-continued

Relative velocity at the end of exposure $(\Delta V_{OUT})$ = retract travel velocity $(V_{OUT})$ − linear velocity of master disc $(V_d)$  (Eq. 2)

Primary feature of the present invention is to adjust electron beam travel velocity in such a manner as to satisfy the following condition 1 and/or condition 2. That is, Incidence travel velocity $(V_{IN})$=retract travel velocity $(V_{OUT})$  (Condition 1)

Relative velocity at the start of exposure $(\Delta V_{IN})$=relative velocity at the end of exposure $(\Delta V_{OUT})$.  (Condition 2)

FIG. 4B shows pits formed based on the above-mentioned condition 1. It is understood that in each of the pit on the inner circumferential side and the pit on the outer circumferential side, the shape of the leading end and that at the trailing end coincide and uniform shapes are exhibited. Consequently, condition 1 is useful as regards equalizing of the shapes at the pit leading end and trailing end.

However, as clear from the figure, the shape of the pit on the inner circumferential side differs from that on the outer. This indicates the case when the disc is exposed by a constant angular velocity (so-called "CAV") method. In the CAV method, the rotating velocity differs on the inner circumference and outer circumference. The greater the difference between the electron beam travel velocity and resist master disc 108 rotating velocity ($V_d$), the greater is the roundness of the shapes at the leading end and the trailing end.

When the pit shape differs according to positions on the disc, problems may occur in accessing the disc. Consequently, for condition 1, the constant linear velocity (CLV) method is preferable. This is because the CLV method provides the same rotating velocity at any position of the disc on the inner and the outer circumferences of resist master disc 108.

On the other hand, FIG. 4C shows pits formed according to condition 2. In the case of condition 2, both pits on the inner circumferential side and outer circumferential side have equal shapes at the leading end and trailing end and exhibit uniform shapes. Furthermore, according to condition 2, pits of equal shapes at the leading and trailing end can be formed irrespective of the resist master disc 108 position. When condition 2 is satisfied, pits with a uniform shape can be formed even if the disc is exposed by either CAV method or CLV method. By adjusting the electron beams travel velocity in such a manner as to satisfy both conditions 1 and 2, both advantages mentioned above can be obtained.

Referring now to FIG. 5, description will be made on the control for allowing the electron beams to travel on shield plate 106. This control is carried out by voltage controller 111 (FIG. 1). FIG. 5A shows the electron beam position in the shield plate using X-Y coordinates. As described above, the positions of electron beams are defined based on the voltage applied to electrodes 104 and 105 (FIG. 1) by voltage controller 111 (FIG. 1). FIG. 5B is a timing chart showing timing of voltage applied to electrode 104 (FIG. 1). Since the voltage applied to electrode 104 controls the movement of the electron beams in the Y-axis direction, this voltage is hereinafter called the "Y-direction control voltage." FIG. 5C is a timing chart showing timing of voltage applied to electrode 105 (FIG. 1). Since the voltage applied to electrode 105 controls the movement of the electron beams in the X-axis direction, this voltage is hereinafter called the "X-direction control voltage."

As shown in FIG. 5A, the electron beams exist at the initial position A (0, y) at time $t=t_0$. In such event, the Y-direction control voltage is negative and X-direction control voltage is 0V. From this point, the electron beams travel to position O (0, 0) in the slit on or before time $t=t_1$. That is, the Y-direction control voltage gradually becomes 0V. Since the electron beams do not travel in the X direction, the X-direction control voltage is held to 0V. As described above, the travel velocity of the electron beams is extremely high and is directly subject to the velocity at which control signals are entered. The control signal referred to here is the Y-direction control voltage. More specifically, in FIG. 5B, the gradient of graph of the Y-direction control voltage at time intervals $t=[t_0, t_1]$ (voltage change per unit time) is proportional to the travel velocity of the electron beams. Consequently, if the travel velocity is desired to be more increased, the time intervals of the change should be shortened, and if it is desired to be decreased, the time intervals should be increased.

Because at time intervals $t=[t_0, t_2]$, the electron beams exist in the slit, resist master disc 108 (FIG. 3) is exposed. The pit length can be obtained by multiplying the linear velocity in such event by the length of this time interval. When pit exposure is finished at time $t=t_2$, the electron beams are retracted to the B (0, −y) position on and before time $t=t_3$. Consequently, the Y-direction control voltage is gradually increased from 0V. What must be taken into account is at least to keep the gradient of Y-direction control voltage graph at time intervals $t=[t_0, t_1]$ equal to the gradient of Y-direction control voltage graph at time intervals $t=[t_2, t_3]$ until the electron beams pass through the slit.

Therefore, the above-mentioned condition 1 is satisfied. In order to satisfy the condition 2, the linear velocity of resist master disc 108 (FIG. 1) is required. The linear velocity can be calculated by allowing voltage controller 111 (FIG. 1) to obtain the rotating velocity information or the angular velocity information according to the rotation of turntable 109. For example, let w denote the angular velocity and r denote the distance of the recording position from the rotation center; then, we have the linear velocity λ by λ=r·ω.

When the electron beams travel to the B (0, −y) position, processing for returning the electron beams again to A (0, y) position takes place. First of all, during the period to time intervals $t=[t_3, t_4]$, the X-direction control voltage gradually increases. Therefore, the electron beams travel to the positive direction of x-axis in FIG. 5A and travels to the C (x, −y) position. The Y-direction control voltage is kept to the positive specified value in order to fix the electron beams to the Y=−y position. Thereafter, during the period to time intervals $t= [t_4, t_5]$, the Y-direction control voltage is gradually decreased to the negative value, which is the same as the Y-direction control voltage at time $t=t_0$. Therefore, at $t=t_5$, the electron beams travel to D (x, y). The X-direction control voltage is kept to the positive predetermined value in order to fix the electron beams at X=x position. Lastly, during the period up to time intervals $t=[t_5, t_6]$, the X-direction control voltage is gradually decreased to 0V. Thus, at time $t= t_6$, the electron beams again return to A (0, y). It takes several ns from time $t= t_2$ to $t=t_6$.

As described above, according to voltage controller 111 (FIG. 1) that controls Y-direction control voltage applied to electrode 104 and X-direction control voltage applied to electrode 105, the travel of the electron beams in an arbitrary directions, on the shielding sections and the slit 20, can be controlled and the desired patterns can be formed on resist master disc 108 (FIG. 1).

Referring now to FIGS. 6A through 9C, description will be made on various patterns which can be formed by electron beam recorder 100 (FIG. 1). In FIGS. 6A through 9C, too, the gradient of control voltage as described in FIGS. 5B and 5C exists, but for convenience of description, they are not specified but are expressed by simplifying them as a leading edge or a trailing edge in the vertical direction.

FIGS. 6A through 6D show control signals for exposing continuous pit patterns and the exposed patterns. When the signal pit pattern is exposed and recorded, first of all, the information signal shown in FIG. 6A is entered. This is the information corresponding to the desired pit pattern shown in FIG. 6D. Specifically, the information signal becomes a high level at the exposing timing and a low level at the non-exposing timing.

From the information signal shown in FIG. 6A, the modulating signal shown in FIG. 6B and the wobble signal shown in FIG. 6C are formed. The modulating signal corresponds to the Y-direction control signal (FIG. 5B) mentioned above and is entered in electrode 104 (FIG. 1) for changing the electron beams in the recording tangential direction of the resist master disc. As explained while referring to FIG. 5B, a position of the electron beam is varied in accordance with positive, 0, negative of the modulating signal. On the other hand, the wobble signal is entered in electrode 105 (FIG. 1) which changes the electron beams in the direction nearly perpendicular to the recording tangential direction of resist master disc 108. As explained while referring to FIG. 5C, the electron beam position is varied in accordance with positive, 0, negative of the wobble signal.

When the modulating signal shown in FIG. 6B and the wobble signal shown in FIG. 6C are entered, the electron beams are scanned along the counterclockwise circular passage 207 (FIG. 3). The section applied to resist master disc 108 is scanned in the direction same as the direction in which resist master disc 108 travels, and quantities of irradiating energy with respect to resist master disc 108 at the recording pit leading end and trailing end are kept constant. In addition, the electron beams travel counterclockwise on shield plate 106 during the time in which resist master disc 108 is not irradiated with the electron beams, and are applied to the resist mater disc in the same scanning direction when the next pit is recorded.

The inventor of the present invention recorded random signal pits under the conditions of 3 m/s recording linear velocity and about 40 $\mu$C/m electron beam quantity applied to resist master disc 108 using silicon wafer with electron beam resist applied about 100 nm thick as resist master disc 108 (FIG. 1). After recording, development was carried out and the pit profile formed was examined using electron microscope, and as a result, it was confirmed that nearly same width was obtained at the pit leading end and trailing end.

Referring now to FIGS. 7A through 9C, different patterns which can be formed by electron beam recorder 100 (FIG. 1). In FIGS. 7A through 9C, signals corresponding to FIG. 6A are omitted.

FIGS. 7A through 7C show control signals for exposing wobble grooves and the exposed patterns. The wobble grooves are patterns in which grooves are waved right and left in the form of sine waves. Since the wobble grooves are exposed as continuous grooves, it is not necessary to interrupt exposure halfway. That is, the electron beams do not travel in the Y-axis direction shown in FIG. 5A except at the start of exposure and at the end of exposure. Consequently, the modulating signal shown in FIG. 7A is kept to 0V from the beginning to the end of exposure. On the other hand, in order to expose wobbled patterns, the electron beams must be vibrated in the X-axis direction when the electron beams exist at the position of O (0, 0) (FIG. 5A). Consequently, the wobble signals shown in FIG. 7B exhibit the vibrating patterns that correspond to the desired exposure patterns. Note that, at the start of exposure and at the end of exposure, the electron beams are controlled to satisfy above-mentioned conditions 1 or conditions 2.

FIGS. 8A through 8C show control signals for exposing wobble grooves and pit addresses and the exposed pattern. This pattern is formed by compounding grooves and address pits, which are adopted in DVD-RAM, etc. Consequently, control signals and exposure patterns can be obtained by combining FIGS. 6B, 6C, 7A, and 7B. The address pits are arranged one-half track each wobbled right and left with respect to the groove center. In the figure, pits are located one each on the right and the left, but a plurality of pits may exist. Since each wobble groove pattern and each pit address pattern satisfy condition 1 or condition 2, respectively, the width at each trailing end and each leading end becomes nearly equal.

FIGS. 9A through 9C show control signals for exposing wobble grooves and land prepit addresses and the exposed pattern. This pattern has notched-form address pits in the midway of the groove and in the land between adjacent grooves as is the case of CD-R/RW, etc. With respect to the wobble groove, the control signal same as that explained referring to FIGS. 7A through 7C can be utilized. With respect to the address pit section, the wobble signal voltage should be varied more greatly as shown in FIG. 9B.

With the foregoing description, the embodiment of the present invention has been described. In the foregoing description, the electron beams were scanned in the direction same as the direction in which a resist master disc travels, but the same effects can be obtained by scanning the electron beams in the reverse direction. That is, nearly equal pit width can be obtained at the pit leading end and at the pit trailing end. Note that, scanning the electron beams in the same direction with respect to the direction in which the resist master disc travels can shorten the distance in which the resist master disc is irradiated with the electron beams at sections in which pit leading end and the trailing end are formed and still more beautiful pit profile can be obtained.

In addition, in the present specification, shield plate 106 (FIG. 2) was explained to have a linear edge. However, the same effects can be obtained with the shield plate with circular edges which have the nearly same profile as that of the electron beams. In addition, electron beam travel passage 207 (FIG. 3) on shield plate 106 was explained to be a rectangle, but may be a passage of other profile such as triangle, ring-shape, etc.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electron beam recorder that records desired patterns on a resist master disc by passing and shielding electron beams, comprising:
   an electron beam source that discharges electron beams;

a voltage controller that generates voltages based on a predetermined information signals;

control electrodes that deflect the electron beams based on the voltages generated by the voltage controller;

a shield plate having a passing position to pass the electron beams and a shielding position to shield the electron beams; and a turntable that carries and rotates the resist master disc, wherein the voltage controller controls the voltages applied to the control electrodes to substantially equalize a first velocity of the electron beams to travel from a first shielding position to the passing position with a second velocity of the electron beams to travel from the passing position to a second shielding position.

2. The electron beam recorder according to claim 1, wherein the voltage controller receives information on a rotating velocity of the resist master disc from the turntable to obtain a linear velocity of the resist master disc, and substantially equalizes a first relative velocity, defined from the linear velocity and the first velocity, with a second relative velocity, defined from the linear velocity and the second velocity.

3. The electron beam recorder according to claim 1, wherein directions of the first velocity and the second velocity are the same.

4. The electron beam recorder according to claim 3, wherein the control electrodes comprises a first electrode that deflects the electron beams in a first direction and a second electrode that deflects the electron beams in a second direction different from the first direction, wherein the voltage controller controls each voltage applied to the first electrode and the second electrode to move the electron beams by deflecting from the second shielding position to the first shielding position via positions on the shield plate.

5. The electron beam recorder according to claim 3, wherein the directions of the first velocity and the second velocity are the same as a rotating direction of the resist master disc.

6. The electron beam recorder according to claim 1, wherein the shield plate comprises:

a first shielding section that defines the first shielding position;

a second shielding section that defines the second shielding position; and a slit defined between the first shielding section and the second shielding section as the passing position.

7. The electron beam recorder according to claim 6, wherein the shield plate further comprises a third shielding section that connects the first shielding section to the second shielding section, and wherein the control electrodes deflect to move the electron beams from the second shielding position to the first shielding position via the third shielding section.

8. The electron beam recorder according to claim 6, wherein a width of the slit is substantially equal to a diameter of the electron beam.

9. An electron beam recorder that records desired patterns on a resist master disc by passing and shielding electron beams, comprising:

an electron beam source that discharges electron beams;

a voltage controller that generates voltages based on a predetermined information signals;

control electrodes that deflect the electron beams based on the voltages generated by the voltage controller;

a shield plate disposed between the control electrodes and the resist master disc, said shield plate having a first shielding section and a second shielding section as shielding positions to shield the electron beams, and a slit as a passing position to pass the electron beams;

a turntable that carries and rotates the resist master disc, wherein the control electrodes deflect the electron beams in arbitrary directions on the first shielding section, the second shielding section and the slit, based on the voltages generated by the voltage controller.

10. An electron beam recording method used in an electron beam recorder to record desired patterns on a resist master disc by passing and shielding electron beams, the electron beam recorder including:

an electron beam source that discharges electron beams;

a voltage controller that generates voltages based on a predetermined information signals;

control electrodes that deflect the electron beams based on the voltages generated by the voltage controller;

a shield plate having a passing position to pass the electron beams and a shielding position to shield the electron beams; and a turntable that carries and rotates the resist master disc, the method comprising steps of:

deflecting the electron beams to move from the first shielding position to the passing position at a first velocity;

irradiating the resist master disc with the electron beams via the passing position; and deflecting the electron beams to move from the passing position to the second shielding position at a second velocity substantially equal to the first velocity.

11. The electron beam recording method according to claim 10, wherein the step of moving the electron beams at the second velocity further comprises steps of:

receiving the information on a rotating velocity of the resist master disc from the turntable to obtain a linear velocity of the resist master disc; and substantially equalizing a first relative velocity, defined from the linear velocity and the first velocity, with a second relative velocity, defined from the linear velocity and the second velocity.

12. An electron beam recording method according to claim 10, wherein directions of the first velocity and the second velocity are the same.

13. The electron beam recording method according to claim 12, wherein the control electrodes comprises a first electrode that deflects the electron beams in a first direction and a second electrode that deflects the electron beams in a second direction different from the first direction, wherein the voltage controller controls each voltage applied to the first electrode and the second electrode to move the electron beams by deflecting from the second shielding position to the first shielding position via positions on the shield plate.

14. The electron beam recording method according to claim 12, wherein the directions of the first velocity and the second velocity are the same as a rotating direction of the resist master disc.

15. An electron beam controlling method used in an electron beam recorder which includes:

an electron beam source that discharges electron beams;

a voltage controller that generates voltages based on a predetermined information signals;

control electrodes that deflect the electron beams based on the voltages generated by the voltage controller; and a shield plate having a passing position to pass the electron beams and a shielding position to shield the electron beams, the method comprising steps of:

firstly changing the voltages at a predetermined variation per unit of time;

deflecting the electron beams by the voltages changed in the firstly changing step to move the electron beams from a first shielding position to the passing position at a first velocity;

secondly changing the voltages at the predetermined variation; and deflecting the electron beams by the voltages changed in the secondly changing step to move the electron beams from the passing position to a second shielding position at a second velocity substantially equal to the first velocity.

* * * * *